United States Patent
Fu et al.

(10) Patent No.: US 11,575,112 B2
(45) Date of Patent: Feb. 7, 2023

(54) GASKET FOR DISPLAY DEVICE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Chao Fu, Beijing (CN); Shihua Huang, Beijing (CN); Jing Wang, Beijing (CN); Wei Li, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 212 days.

(21) Appl. No.: 16/957,704

(22) PCT Filed: Dec. 18, 2019

(86) PCT No.: PCT/CN2019/126279
§ 371 (c)(1),
(2) Date: Jun. 24, 2020

(87) PCT Pub. No.: WO2020/147494
PCT Pub. Date: Jul. 23, 2020

(65) Prior Publication Data
US 2021/0167317 A1    Jun. 3, 2021

(30) Foreign Application Priority Data

Jan. 17, 2019 (CN) .......................... 201910044024.X

(51) Int. Cl.
*H01L 51/52* (2006.01)
*H01L 25/18* (2006.01)

(52) U.S. Cl.
CPC ............ *H01L 51/529* (2013.01); *H01L 25/18* (2013.01); *H01L 2251/5338* (2013.01)

(58) Field of Classification Search
CPC .................................................... H01L 51/529
See application file for complete search history.

(56) References Cited

U.S. PATENT DOCUMENTS

| 10,236,471 B2 | 3/2019 | Oh et al. |
| 2014/0003022 A1 | 1/2014 | Lee |
| (Continued) | | |

FOREIGN PATENT DOCUMENTS

| CN | 205303466 U | 6/2016 |
| CN | 107180850 A | 9/2017 |
| (Continued) | | |

OTHER PUBLICATIONS

Wang et al., CN 111312660, published Jun. 19, 2020.*
(Continued)

*Primary Examiner* — Suberr L Chi
(74) *Attorney, Agent, or Firm* — McCoy Russell LLP

(57) ABSTRACT

The present disclosure provides a gasket for a display device and a display device. The gasket includes a body, the body having a plurality of via hole structures penetrating through the body in the same direction. The display device includes a display panel, the display panel having a bending structure bent toward the back of the display panel, the gasket being located between the bending structure and the display panel opposite to the bending structure, and the gasket is the above-mentioned gasket.

9 Claims, 5 Drawing Sheets

(56) References Cited

U.S. PATENT DOCUMENTS

| | | | |
|---|---|---|---|
| 2017/0263891 A1 | 9/2017 | Oh et al. | |
| 2018/0027673 A1* | 1/2018 | Andou | H05K 5/0017 361/749 |
| 2019/0173052 A1 | 6/2019 | Oh et al. | |
| 2020/0052248 A1* | 2/2020 | Cho | H01L 51/5281 |

FOREIGN PATENT DOCUMENTS

| | | |
|---|---|---|
| CN | 108648632 A | 10/2018 |
| CN | 109728201 A | 5/2019 |

OTHER PUBLICATIONS

Google Patents machine translation of CN 111312660.*
State Intellectual Property Office of the People's Republic of China, Office Action and Search Report Issued in Application No. 201910044024.X, dated Mar. 2, 2020, 12 pages. (Submitted with Partial Translation).
ISA China National Intellectual Property Administration, International Search Report Issued in Application No. PCT/CN2019/126729, dated Mar. 18, 2020, WIPO, 15 pages. (Submitted with Partial Translation).
State Intellectual Property Office of the People's Republic of China, Office Action and Search Report Issued in Application No. 201910044024.X, dated Sep. 8, 2020, 14 pages. (Submitted with Partial Translation).

* cited by examiner

GASKET FOR DISPLAY DEVICE AND DISPLAY DEVICE

CROSS-REFERENCE TO RELATED APPLICATIONS

The present application is a U.S. national phase application of International Application No. PCT/CN2019/126279 filed on Dec. 18, 2019, which claims a priority to Chinese Patent Application No. 201910044024.X filed on Jan. 17, 2019. The entire contents of each of the above-listed applications are hereby incorporated by reference for all purposes.

TECHNICAL FIELD

The present disclosure relates to the field of display technology, in particular, to a gasket for display device and a display device.

BACKGROUND AND SUMMARY

Pad bending process is a manufacturing process that is widely used in organic electroluminescent display (OLED) type flexible display panels, and this process can achieve a narrow frame and achieve the largest screen ratio. The pad bending process requires the use of a gasket in the bending area as structural support to avoid physical breakage of the OLED panel or damage to the internal signal line due to a too small bending angle during the bending. However, a material of the gasket used in the existing bending area is not conducive to heat dissipation and conduction, which may result in poor display of the display area of the OLED panel that is in contact with the gasket after the pad bending.

In one aspect, the present disclosure provides a gasket for a display device, including a body, the body having a plurality of via hole structures penetrating through the body in a same direction.

Optionally, the body has a first portion and a second portion, the first portion and the second portion are an integral structure, and a structure of the second portion is an arc-shaped structure.

Optionally, the plurality of via hole structures is closely arranged.

Optionally, a cross-sectional shape of the plurality of via hole structures is a triangle, a square, a circle or a polygon.

Optionally, the polygon includes a hexagon.

Optionally, a material of the body includes polyterephthalic acid plastic.

Optionally, the material constituting the body further includes a material having better thermal conductivity than the polyterephthalic acid plastic.

Optionally, the material having better thermal conductivity than the polyterephthalic acid plastic includes graphite, carbon fiber, or a combination of graphite and carbon fiber.

On the other hand, the present disclosure also provides a display device including a display panel, the display panel having a bending structure bent toward the back of the display panel, a gasket being located between the bending structure and the display panel opposite to the bending structure, and the gasket is the gasket according to any one of the above embodiments.

Optionally, the bending structure has an arc-shaped area, the first portion of the body corresponds to the display area proximate to the bending structure, and the second portion of the body fills the arc-shaped area.

Optionally, an extending direction of the plurality of via hole structures is perpendicular to a display surface of the display panel.

Optionally, an extending direction of the plurality of via hole structures is parallel to a display surface of the display panel.

DETAILED DESCRIPTION

Figure 1:
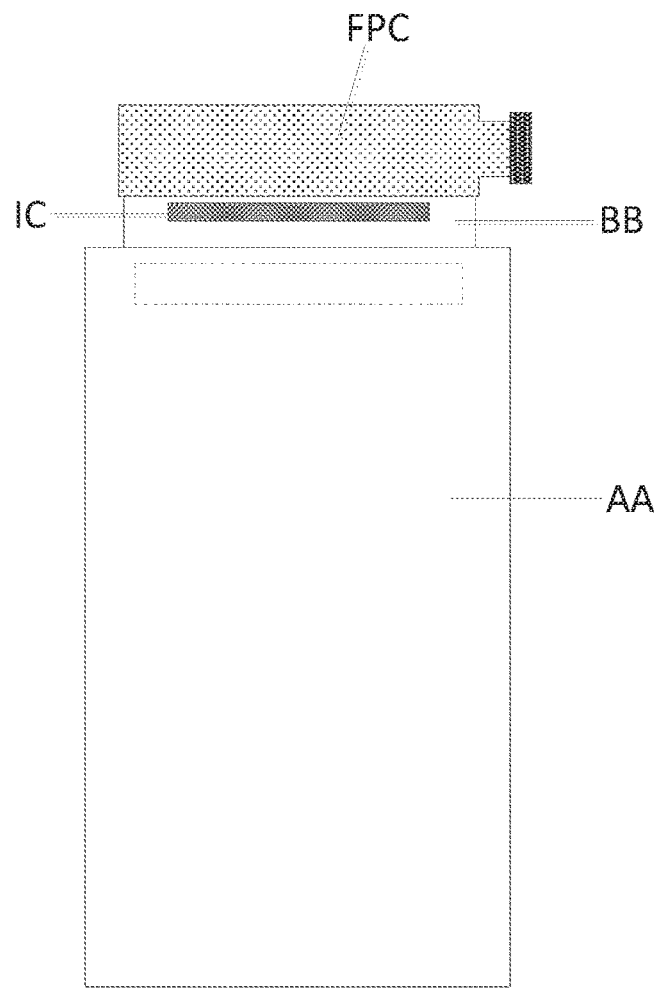
FIG. 1 is a schematic view showing the structure of the display panel in the related art.

In order to make the purpose, technical solutions and advantages of the disclosure in a more clear manner, the disclosure will be further described in detail below in conjunction with the drawings. Obviously, the following embodiments relate to a part of, rather than all of, the embodiments of the present disclosure. The shapes and sizes of the various components in the drawings do not reflect true proportions, but are merely intended to illustrate the present disclosure. Based on these embodiments, a person skilled in the art may, without any creative effort, obtain the other embodiments, which also fall within the scope of the present disclosure.

Figure 2:
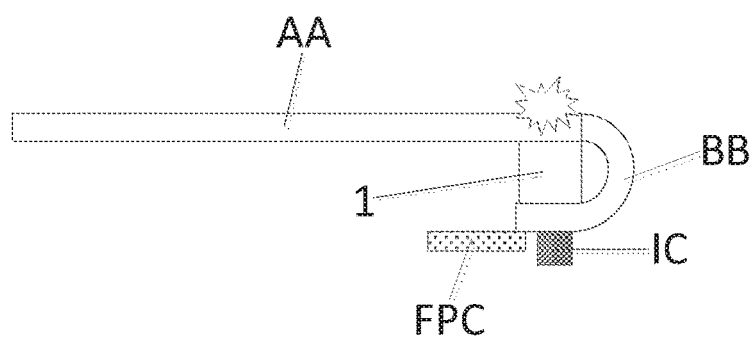
FIG. 2 is a schematic view showing another structure of the display panel in the related art.
Figure 3:
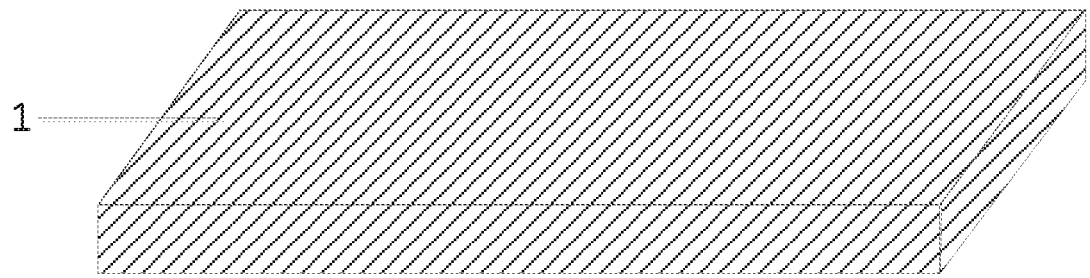
FIG. 3 is a schematic view showing the structure of the gasket in the related art.

In the related art, in order to realize the narrow frame of the display device and the maximum screen ratio of the screen, the flexible circuit board FPC, the driving chip IC and other components are bent to the back of the display panel by pad bending process. FIG. 1 is a schematic view showing the top structure of the pad display panel before the pad bending process, FIG. 2 is a schematic view showing the cross-sectional structure of the display panel after the pad bending process, and FIG. 3 is a schematic view showing the structure of the gasket in the prior art. As shown in FIGS. 1 to 3, the display panel includes a display area AA and a bending area BB, and a flexible circuit board FPC and a driving chip IC located in the bending area BB. As shown in FIG. 2, when the flexible circuit board FPC, driving chip IC and other components are bent to the back of the display panel, it is necessary to use a gasket 1 in the bending area BB as structural support to avoid physical breakage of the display panel or damage to the internal signal line due to a too small bending angle during the bending.

After the pad bending process, the product generates significant heat when the driver IC works in a reliable environment or other harsh environments (such as high temperature and high humidity), and the pixels of the OLED display panel generate heat during operation, so during a certain period of time, there is more heat accumulated in the bending area BB, resulting in the temperature in the bending area BB to rise faster. However, the structure and material of the gasket used in the existing bending zone BB are not conducive to the heat emission and conduction. As shown in FIG. 3, in the prior art, the structure of the gasket is a dense structure, and the material is PET material. When the driving chip IC in the bending area BB works and the OLED display panel works, the heat is quickly accumulated, and the heat cannot be dissipated and conducted in time, which will result in the poor display of the display area AA of the OLED display panel in contact with the gasket 1 after the pad bending process, as shown by the dotted frame area in FIG. 1, which corresponds to the poor display of the broken-line circular area in FIG. 2.

In view of this, the embodiments of the present disclosure provide a gasket for a display device and a display device, which are used to solve the problem that the gasket in the prior art is not conducive to heat dissipation and conduction, resulting in poor display of the display panel.

Figure 4:
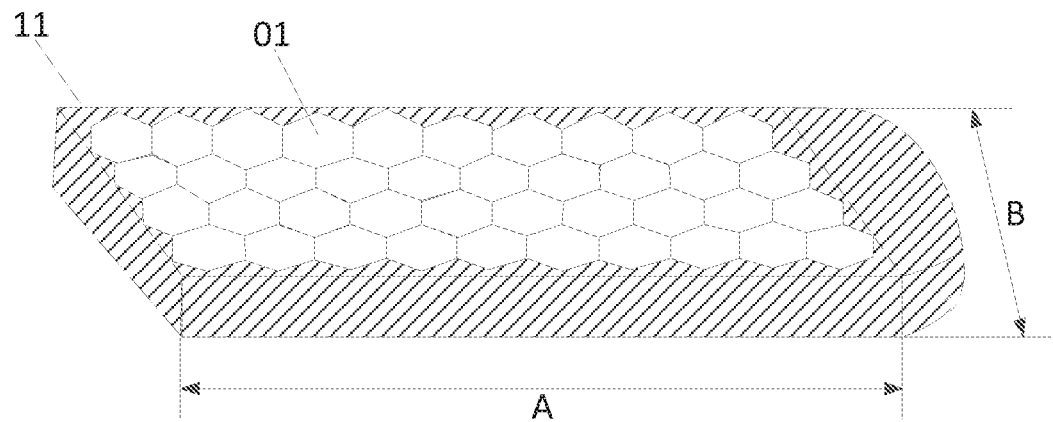
FIG. 4 is a schematic view showing the structure of the gasket according to an embodiment of the present disclosure.

Specifically, an embodiment of the present disclosure provides a gasket for a display device. As shown in FIG. 4, the gasket includes a body 11 having a plurality of via holes structures 01 penetrating through the body 11 in the same direction.

The embodiments of the present disclosure can produce the following beneficial technical effects: by arranging the body of the gasket used for the display device to have a plurality of via hole structures, the via hole structures is conducive to heat dissipation and conduction, so that there will be no poor display in the display panel area corresponding to the gasket.

In the above gasket according to the embodiment of the present disclosure, as shown in FIG. 4, the body 11 may optionally have a first portion A and a second portion B, the first portion A and the second portion B are an integral structure, and a structure of the second portion B is an arc-shaped structure.

When the gasket according to the embodiment of the present disclosure is applied to a narrow frame display device, the narrow frame display device needs to bend the flexible circuit board FPC, driving chip IC and other components to the back of the display panel. In order to avoid physical breakage of the display panel or damage to the internal signal lines due to too small bending angle during bending, it is necessary to use gaskets as structural support in the bending area, and the shape of the bending area is generally an arc-shaped structure. Since the structure of the second portion B of the body 11 of the gasket is configured as an arc-shaped structure in the present disclosure, the second portion B of the arc-shaped structure may be formed in the arc-shaped area of the bending area. By reasonably setting the size of the gasket, the bending structure can be bent along the second portion B when bending, so that the second portion completely fills the arc-shaped area, which can further prevent the display panel from being physically broken or the internal signal line from being damaged when the angle is too small.

It should be noted that both the first portion A and the second portion B of the body 11 may have via hole structures 01. For illustrative purposes, FIG. 4 of an embodiment of the present disclosure only illustrates that the first portion A has via hole structures 01.

Optionally, in order to expedite the heat dissipation and conduction in the area corresponding to the gasket, in the above gasket according to the embodiment of the present disclosure, as shown in FIG. 4, each of the via hole structures 01 is closely arranged.

Figure 5:
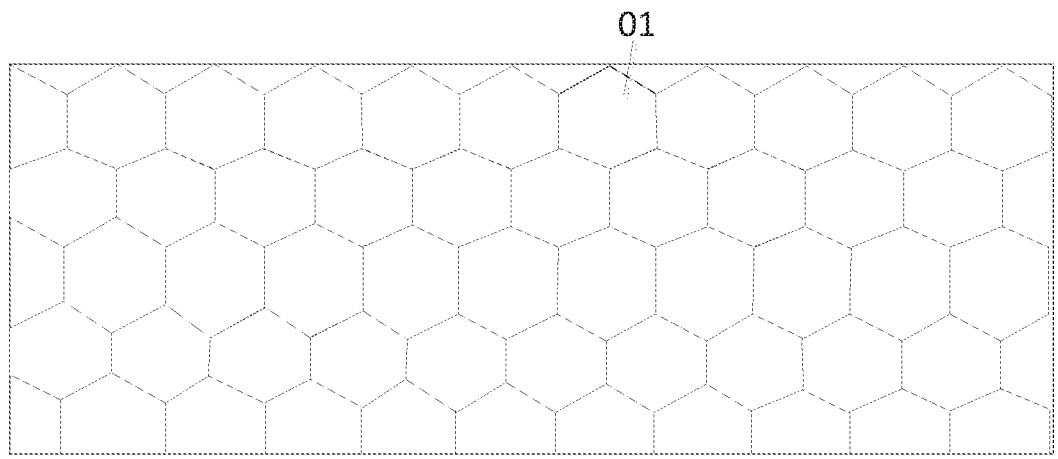
FIG. 5 is a schematic view showing the cross-sectional structure of the via hole structures according to an embodiment of the present disclosure.
Figure 6:
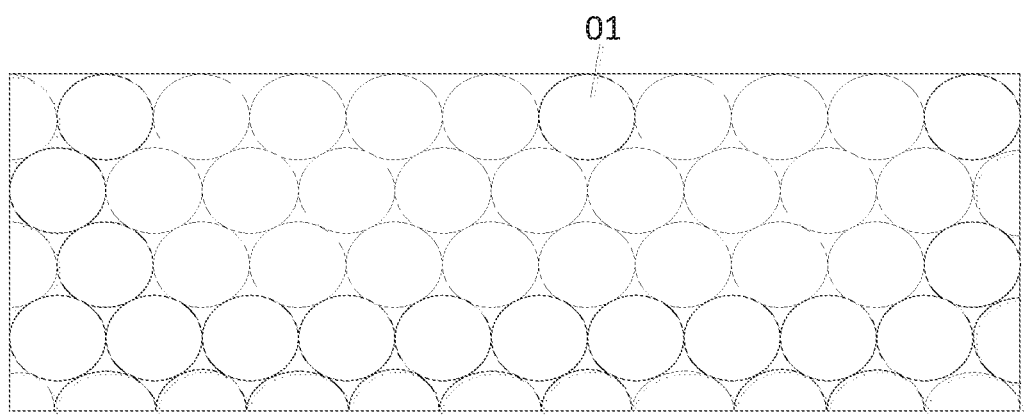
FIG. 6 is a schematic view showing the cross-sectional structure of the via hole structures according to another embodiment of the present disclosure.
Figure 7:
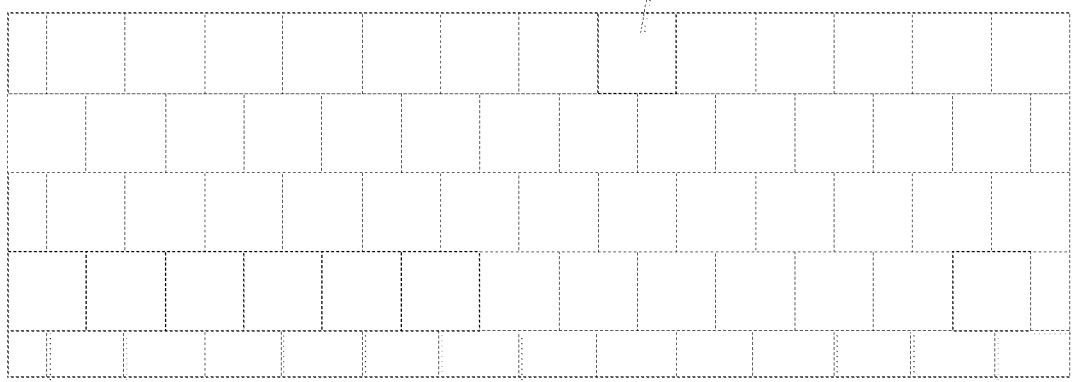
FIG. 7 is a schematic view showing the cross-sectional structure of the via hole structures according to a still another embodiment of the present disclosure.
Figure 8:
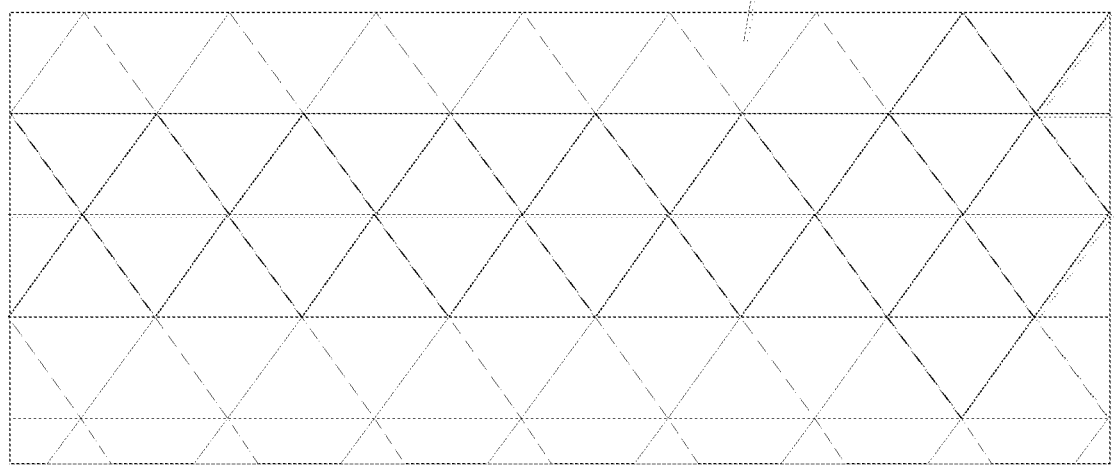
FIG. 8 is a schematic view showing the cross-sectional structure of the via hole structures according to a yet still another embodiment of the present disclosure.

Optionally, in the above gasket according to an embodiment of the present disclosure, the cross-sectional shape of the via hole structures may a polygon or a circle. For example, the cross-sectional shape of the via hole structures may be a triangle, a square, or a hexagon. As shown in FIG. 5, the cross-sectional shape of the via hole structures 01 is, for example, a polygon. As shown in FIG. 6, the cross-sectional shape of the via hole structures 01 is, for example, a circle. As shown in FIG. 7, the cross-sectional shape of the via hole structures 01 is, for example, a square. As shown in FIG. 8, the cross-sectional shape of the via hole structures 01 is, for example, a triangle.

Optionally, as shown in FIG. 5, the polygon may include a hexagon. Of course, the cross-section shape of the via hole structures 01 may also be other polygons, as long as the cross-section shape of the via hole structures 01 is a ring, which all falls within the protection scope of the present disclosure, and the examples thereof are not given herein.

Optionally, a material of the body 11 includes polyterephthalic acid plastic.

Optionally, in order to further accelerate the heat dissipation and conduction in the area corresponding to the gasket, the material constituting the body further may include a material having better thermal conductivity than the polyterephthalic acid plastic.

The thermal conductivity of PET material is 0.2 W/m·K, the thermal conductivity of carbon fiber material is in a range from 400 to 700 W/m·K, and the thermal conductivity of graphite material is 135 W/m·K. Therefore, in the above gasket according to the embodiment of the present disclosure, the material having better thermal conductivity than the polyterephthalic acid plastic may include graphite, carbon fiber, or a combination of graphite and carbon fiber. That is, graphite, carbon fiber or a combination of graphite and carbon fiber having good thermal conductivity can be added as a gasket material to the polyterephthalic acid plastic. Moreover, graphite and carbon fiber itself have high heat resistance and good mechanical properties, so the gasket made of the above mixed material can quickly dissipate and conduct the heat of the area corresponding to the gasket, and reduce the problem of poor display in the display panel area corresponding to the gasket.

Figure 9:
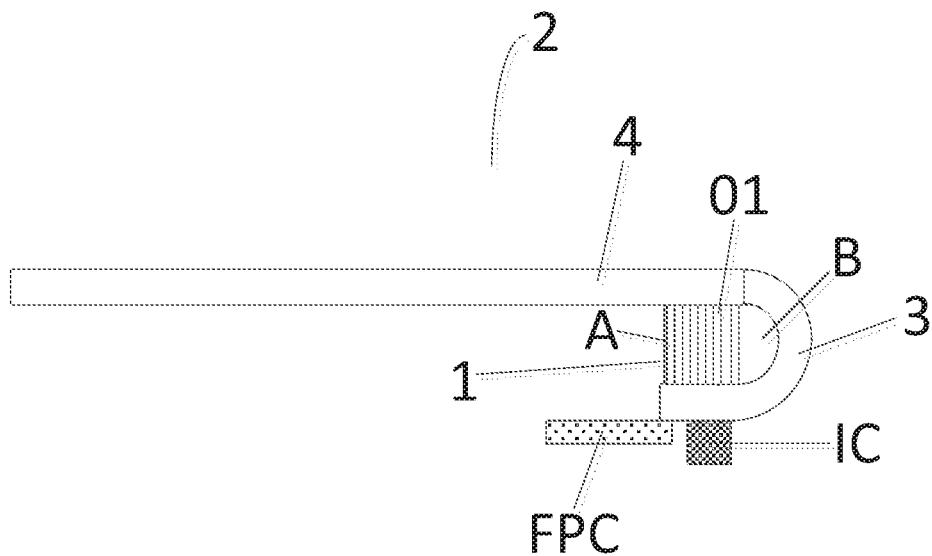
FIG. 9 is a schematic view showing the structure of the display device according to an embodiment of the present disclosure.
Figure 10:
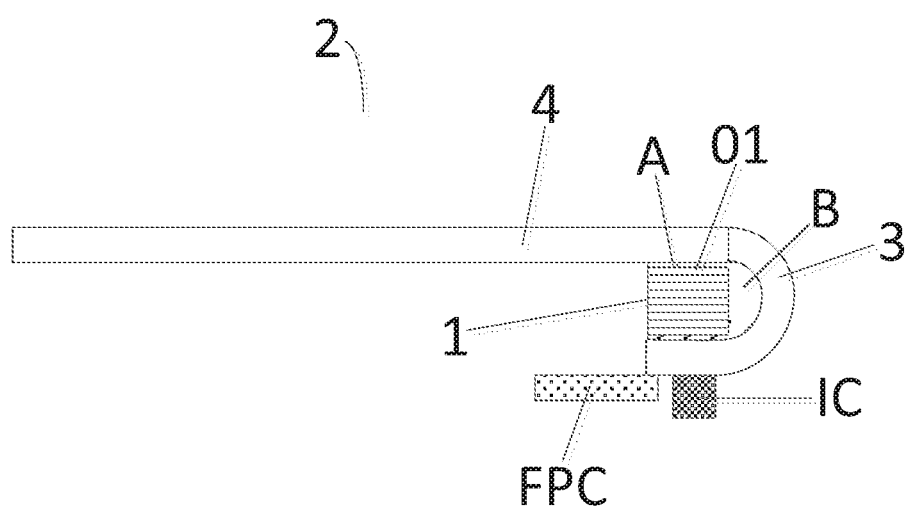
FIG. 10 is a schematic view showing the structure of the display device according to another embodiment of the present disclosure.

Based on the same inventive concept, an embodiment of the present disclosure also provides a display device, as shown in FIGS. 9 and 10, the display device includes a display panel 2, the display panel having a bending structure 3 bent toward the back of the display panel, a gasket 1 being located between the bending structure 3 and the display panel opposite to the bending structure 3, and the gasket 1 is the gasket according to any one of the above embodiments of the present disclosure. Since the principle of the display device to solve the problem is similar to any one of the above gaskets 1, the implementation of the display device can be referred to the implementation of the above gasket 1, and the repetition is not repeated.

Optionally, as shown in FIGS. 9 and 10, the bending structure 3 has an arc-shaped area, the first portion A of the body 11 corresponds to the display area proximate to the bending structure 3, and the second portion B of the body 11 fills the arc-shaped area. The second portion B of the body 11 can further prevent the display panel from being physically broken or the internal signal line from being damaged when the angle is too small.

Optionally, as shown in FIG. 9, in the above display device according to an embodiment of the present disclosure, an extending direction of the via hole structures 01 may be perpendicular to a display surface 4 of the display panel.

Optionally, as shown in FIG. 10, in the above display device according to an embodiment of the present disclosure, an extending direction of the via hole structures 01 is parallel to a display surface 4 of the display panel.

The extending direction of the via hole structures 01 is not limited to the above two manner, and may have a certain inclination angle with respect to the display surface of the display panel. As long as the body 11 of the gasket has the via hole structures 01, it belongs to the protection scope of the present disclosure, and the examples thereof are not given here.

The above display device according to the embodiment of the present disclosure may be a tablet computer, a television, a display, a notebook computer, a digital photo frame, a navigator, or any product or component having a display function. The other indispensable components of the display device are understood and possessed by a person skill in the art, and thus are not repeated herein, nor should be used as a limitation to the present disclosure.

In the above gasket for a display device and the display device according to the embodiments of the present disclosure, by arranging the body of the gasket to have a plurality of via hole structures, the via hole structures is conducive to heat dissipation and conduction, so that there will be no poor display in the display panel area corresponding to the gasket.

It will be apparent to those skilled in the art that various modifications and changes can be made in the present disclosure without departing from the spirit and scope of the disclosure. Therefore, if such modifications and variations of the present disclosure belong to the scope of the appended claims and equivalents thereof herein, the present disclosure is intended to cover these modifications and variations.

The invention claimed is:

1. A display device, comprising a display panel, the display panel having a bending structure bent toward the back of the display panel, a gasket being located between the bending structure and the display panel opposite to the bending structure, wherein the gasket comprises a body and the body has a plurality of via hole structures penetrating through the body in a same direction, and the body has a first portion and a second portion, the first portion and the second portion are an integral structure, and a structure of the second portion is an arc-shaped structure.

2. The display device of claim 1, wherein the bending structure has an arc-shaped area, the first portion of the body corresponds to the display area proximate to the bending structure, and the second portion of the body fills the arc-shaped area.

3. The display device of claim 1, wherein an extending direction of the plurality of via hole structures is perpendicular to a display surface of the display panel.

4. The display device of claim 1, wherein an extending direction of the plurality of via hole structures is parallel to a display surface of the display panel.

5. The display device of claim 1, wherein a cross-sectional shape of the plurality of via hole structures is a circle or a polygon.

6. The display device of claim 5, wherein the polygon includes a triangle, a square, and a hexagon.

7. The display device of claim 1, wherein a material constituting the body comprises polyterephthalic acid plastic.

8. The display device of claim 7, wherein the material constituting the body further comprises a material having better thermal conductivity than the polyterephthalic acid plastic.

9. The display device of claim 1, wherein the material having better thermal conductivity than the polyterephthalic acid plastic comprises graphite, carbon fiber, or a combination of graphite and carbon fiber.

* * * * *